(12) United States Patent
Prasad

(10) Patent No.: US 7,264,641 B2
(45) Date of Patent: Sep. 4, 2007

(54) POLISHING PAD COMPRISING BIODEGRADABLE POLYMER

(75) Inventor: Abaneshwar Prasad, Naperville, IL (US)

(73) Assignee: Cabot Microelectronics Corporation, Aurora, IL (US)

( * ) Notice: Subject to any disclaimer, the term of this patent is extended or adjusted under 35 U.S.C. 154(b) by 119 days.

(21) Appl. No.: 10/705,533

(22) Filed: Nov. 10, 2003

(65) Prior Publication Data

US 2005/0098540 A1  May 12, 2005

(51) Int. Cl.
  B24D 11/00  (2006.01)
  B24B 1/00  (2006.01)
  B24B 29/00  (2006.01)

(52) U.S. Cl. ............................ 51/298; 51/295; 51/307; 51/308; 51/309; 51/293; 451/526; 451/523; 451/539; 451/537; 451/28; 523/124; 523/201

(58) Field of Classification Search ................. 51/295, 51/298, 307, 308, 309, 293; 451/28, 526, 451/532, 539, 537; 438/689, 691, 692; 216/96, 216/100, 102, 105; 523/124, 201
See application file for complete search history.

(56) References Cited

U.S. PATENT DOCUMENTS

| | | | |
|---|---|---|---|
| 5,470,944 A * | 11/1995 | Bonsignore ................. | 528/354 |
| 5,489,233 A | 2/1996 | Cook et al. | |
| 5,593,778 A | 1/1997 | Kondo et al. | |
| 5,883,199 A | 3/1999 | McCarthy et al. | |
| 5,893,796 A | 4/1999 | Birang et al. | |
| 5,910,368 A | 6/1999 | Ehret | |
| 6,372,331 B1 | 4/2002 | Terada et al. | |
| 6,585,574 B1 * | 7/2003 | Lombardo et al. .......... | 451/285 |
| 6,616,687 B1 * | 9/2003 | Tomihata et al. ........... | 606/228 |
| 6,923,926 B2 * | 8/2005 | Walter et al. ............... | 264/119 |
| 2001/0036804 A1 * | 11/2001 | Mueller et al. ............. | 451/526 |
| 2001/0051692 A1 | 12/2001 | Kanamori et al. | |
| 2002/0094444 A1 | 7/2002 | Nakata et al. | |
| 2003/0003857 A1 * | 1/2003 | Shimagaki et al. ......... | 451/534 |
| 2003/0054735 A1 * | 3/2003 | Misra et al. .................. | 451/41 |
| 2003/0124958 A1 * | 7/2003 | Hirai et al. ................... | 451/28 |
| 2004/0063370 A1 * | 4/2004 | Makiyama et al. ......... | 442/363 |

FOREIGN PATENT DOCUMENTS

| | | |
|---|---|---|
| EP | 1162221 A1 | 12/2001 |
| JP | 2000-109810 A2 | 4/2000 |

OTHER PUBLICATIONS

Ikada et al., "Stereocomplex Formation between Enantiomeric Poly(lactides)," *Macromolecules*, 20, 904-906 (1987), no month.

Kim et al., "Biodegradable Polymer Based on Polylactide," *J. Korean Ind. & Eng. Chem.*, 3 (3), 386, (1992), no month.

Yim, "Biodegradable Polymer Based on PHB(polyhydroxy butyrate)," *J. Korean Ind.& Eng. Chem*, 3 (3), 371 (1992), no month.

Grijpma et al., "Star-shaped polylactide-containing block copolymers," *Makromol Chem. Rapid. Commun.*, 14, 155-161 (1993), no month.

Grijpma et al., "Poly (L-lactide) crosslinked with spiro-bis-dimethylene-carbonate," *Polymer*, 34, 1496-1503 (1993), no month.

Blumm et al., "Miscibility, crystallization and melting of poly(3-hydroxybutyrate)/poly (L-lactide) blends," *Polymer*, 36, 4077-4081 (1995), no month.

Brochu et al., "Stereocomplexation and morphology of polylactides," *Macromolecules*, 28, 5230-5239 (1995), no month.

Ajioka et al., "The basic properties of poly(lactic acid) produced by the direct condensation polymerization of lactic acid," *J. Environ. Polym. Degradation*, 3 (4), 225-234 (1995), no month.

Gajiria et al., "Miscibility and biodegradability of blends of poly(lactic acid) and poly (vinyl acetate)," *Polymer*, 37, 437-444 (1996), no month.

Tsuji et al., "Blends of aliphatic polyesters. I. Physical properties and morphologies of solution-cast blends from poly(DL-lactide) and poly($\epsilon$-caprolactone)," *J. Appl. Polym. Sci.*, 69, 2367-2375 (1996), no month.

Nijenhuis et al., "Crosslinked poly (L-lactide) and poly($\epsilon$-caprolactone)," *Polymer*, 37, 3783-2791 (1996), no month.

Jacobsen et al., "Filling of Poly(Lactic Acid) with Native Starch, " *Polym. Eng. Sci.*, B6 (22), 2799-2804 (1996), no month.

Lee, "*E. coli* moves into the plastic age," *Nature Biotechnol.*, 15, 17-18 (1997), no month.

Hiltunen et al., "Lactic Acid Based Poly (ester-urethanes): Use of Hydroxyl Terminated Prepolymer in Urethane Synthesis," *J. Appl. Polym. Sci.*, 63, 1091-1100 (1997), no month.

Hiltunen, "Synthesis and characterization of lactic acid based poly(ester-urethanes)," *Acta Polytech. Scand., Chem. Technol. Ser.*, 251, 2-56 (1997), no month.

* cited by examiner

*Primary Examiner*—Michael Marcheschi
(74) *Attorney, Agent, or Firm*—Thomas Omholt; Caryn Borg-Breen

(57) ABSTRACT

The invention is directed to a polishing pad for use in chemical-mechanical polishing comprising a biodegradable polymer. The biodegradable polymer comprises a repeat unit selected from the group consisting of glycolic acid, lactic acid, hydroxyalkanoic acids, hydroxybutyric acid, hydroxyvaleric acid, caprolactone, p-dioxanone, trimethylene carbonate, butylene succinate, butylene adipate, monosaccharides, dicarboxylic acid anhydrides, enantiomers thereof, and combinations thereof. The invention is further directed to methods of its use.

6 Claims, No Drawings

POLISHING PAD COMPRISING BIODEGRADABLE POLYMER

FIELD OF THE INVENTION

This invention pertains to a polishing pad for use in chemical-mechanical polishing comprising a biodegradable polymer.

BACKGROUND OF THE INVENTION

Chemical-mechanical polishing ("CMP") processes are used in the manufacturing of microelectronic devices to form flat surfaces on semiconductor wafers, field emission displays, and many other microelectronic workpieces. For example, the manufacture of semiconductor devices generally involves the formation of various process layers, selective removal or patterning of portions of those layers, and deposition of yet additional process layers above the surface of a semiconducting workpiece to form a semiconductor wafer. The process layers can include, by way of example, insulation layers, gate oxide layers, conductive layers, and layers of metal or glass, etc. It is generally desirable in certain steps of the wafer process that the uppermost surface of the process layers be planar, i.e., flat, for the deposition of subsequent layers. CMP is used to planarize process layers wherein a deposited material, such as a conductive or insulating material, is polished to planarize the wafer for subsequent process steps.

In a typical CMP process, a wafer is mounted upside down on a carrier in a CMP tool. A force pushes the carrier and the wafer downward toward a polishing pad. The carrier and the wafer are rotated above the rotating polishing pad on the CMP tool's polishing table. A polishing composition (also referred to as a polishing slurry) generally is introduced between the rotating wafer and the rotating polishing pad during the polishing process. The polishing composition typically contains a chemical that interacts with or dissolves portions of the uppermost wafer layer(s) and an abrasive material that physically removes portions of the layer(s). The wafer and the polishing pad can be rotated in the same direction or in opposite directions, whichever is desirable for the particular polishing process being carried out. The carrier also can oscillate across the polishing pad on the polishing table.

Polishing pads used in chemical-mechanical polishing processes are manufactured using both soft and rigid pad materials, which include polymer-impregnated fabrics, microporous films, cellular polymer foams, non-porous polymer sheets, and sintered thermoplastic particles. Typically, polishing pads are prepared from non-biodegradable polyurethanes. While many of these polishing pads are suitable for their intended use, such polishing pads typically are discarded after use and end up in the solid waste stream, headed for rapidly vanishing and increasingly expensive landfill space. While some efforts at recycling have been made, the nature of polymers and the way they are produced and converted to products limits the number of possible recycling applications. Nevertheless, there is a need for reducing the amount of non-compostable materials in disposable polishing pads.

In addition to being compostable, however, the polishing pads must satisfy many other performance requirements. For example, the polymer resins should be thermoplastic such that conventional polymer processing methods can be employed and relatively inexpensive. Still other properties such as hardness, compressibility, tensile strength, and thermal softening point are important in determining how well the polishing pad will polish a workpiece. Though many biodegradable polymers are known and are used in various plastics applications, biodegradable polymers have not been used in polishing pads for chemical-mechanical polishing.

Accordingly, there remains a need for a polishing pad that provides effective planarization, that can be produced using low cost production methods, and which comprises biodegradable polymers. The invention provides such a polishing pad. These and other advantages of the invention, as well as additional inventive features, will be apparent from the description of the invention provided herein.

BRIEF SUMMARY OF THE INVENTION

The invention provides a polishing pad for use in chemical-mechanical polishing comprising a biodegradable polymer. The biodegradable polymer comprises a repeat unit selected from the group consisting of glycolic acid, lactic acid, hydroxyalkanoic acids, hydroxybutyric acid, hydroxyvaleric acid, caprolactone, p-dioxanone, trimethylene carbonate, butylene succinate, butylene adipate, monosaccharides, dicarboxylic acid anhydrides, enantiomers thereof, and combinations thereof. The invention further provides a method of polishing a workpiece comprising: (i) providing a workpiece to be polished, (ii) contacting the workpiece with a polishing system comprising a polishing pad of the invention and a polishing composition, and (iii) moving the polishing pad relative to the workpiece with the polishing composition therebetween to abrade the workpiece and thereby polish the workpiece.

DETAILED DESCRIPTION OF THE INVENTION

The invention is directed to a polishing pad for use in chemical-mechanical polishing comprising a biodegradable polymer. A biodegradable polymer is a polymer capable of being decomposed in nature. For example, biodegradable polymers can be broken down by biological agents such as bacteria. The biodegradability of the polymers is related to the presence of reactive hydrolytic linkages, such as amide, enamine, ester, urea, and urethane linkages, along the polymer backbone. The presence of such hydrolytic linkages tends to make the polymers highly polar and thus hydrophilic. The biodegradability of the polymer will vary with the nature of the linkage, the nature of the substituent, the configuration of the polymer chains, the conformation of the polymer chains, and the morphology of the polymers. Generally, the more hydrophilic the polymer backbone and polymer endgroups, the more biodegradable the polymer.

Desirably, the biodegradable polymer is a homopolymer, block copolymer, graft copolymer, or random copolymer comprising repeat units containing hydrolysable linkages. Suitable repeat units include those selected from the group consisting of glycolic acid (e.g., the dimer of glycolic acid, glycolide), lactic acid (e.g., the dimer of lactic acid, lactide), hydroxy alkanoic acids such as hydroxybutyric acid and hydroxyvaleric acid, caprolactone, p-dioxanone, trimethylene carbonate, butylene succinate, butylene adipate, monosaccharides (e.g., hexoses such as glucose, fructose, and galactose, as well as pentoses such as ribose and deoxyribose), dicarboxylic acid anhydrides (e.g., anhydrides of sebacic acid and hexadecandioic acid), enantiomers thereof (e.g., L-lactic acid or D-lactic acid), and combinations thereof. Typically, the biodegradable polymer is selected from the group consisting of DL-polylactide (DL- PLA), D-polylactide (DPLA), L-polylactide (LPLA), polyglycolide (PGA), poly(DL-lactide-co-glycolide) (PGLA), poly(ethylene glycol-co-lactide), polycaprolactone (PCL), poly(L-lactide-co-caprolactone-co-glycolide), poly(dioxanone) (PDO), poly(trimethylene carbonate), polyglyconate (e.g., a copolymer of glycolide and trimethylene carbonate), polyhydroxybutyrate (PHB), polyhydroxyvalerate (PHV), polysaccharides (e.g., homopolysaccharides and heteropolysaccharides), poly(1,4-butylene succinate), poly(1,4-butylene adipate), polyanhydrides such as poly(sebacic acid-co-hexadecandioic acid anhydride) (poly(SA-HDA anhydride), polyorthoesters (POE), plasticized starch with poly(caprolactone) (e.g., such as sold under the tradename of Greenpol (SK Chemical)), starch-based aliphatic polyesters (e.g., those sold under the tradename of Sky Green® (SK Chemicals), Bionolle® (Showa), and Eslon Green® (Saehan)), and combinations (e.g., blends) thereof.

Preferably, the biodegradable polymer comprises a lactic acid (e.g., lactide) or hydroxybutyrate repeat unit. More preferably the biodegradable polymer is a polylactide (PLA). PLA is particularly desirably because PLA can be prepared having a wide range of molecular weight, hardness, crystallinity, and thermal properties. Typically, PLA has a Shore D hardness (ASTM D2240) of about 40 to about 90, a density (ASTM D792) of about 1.1 to about 1.3 g/cm$^3$, a glass transition temperature ($T_g$) (DSC) of about 50° C. to about 65° C., a melting temperature ($T_m$) (DSC) of about 130° C. to about 180° C., a melt flow index of about 1 g/10 min to about 40 g/10 min (e.g., about 10 to about 30 g/10 min) at 190° C. and 2.16 kg, a weight average molecular weight ($M_w$) of about 80,000 g/mol to about 300,000 g/mol, a number average molecular weight ($M_n$) of about 30,000 g/mol to about 150,000 g/mol, a polydispersity index (PDI) of about 1.1 to about 4, a flexural modulus (ASTM D790) of about 300 MPa to about 5000 MPa, an ultimate tensile strength (ASTM D638) of about 1000 MPa to about 8000 MPa, and an ultimate elongation (ASTM D638) of about 1% to about 100% PHB has a similarly wide range of thermal and physical properties. Typically, PHB has a Shore D hardness (ASTM D2240) of about 40 to about 80, a density (ASTM D792) of about 1.1 to about 1.3 g/cm$^3$, a midpoint $T_g$ (DSC) of about −20° C. to about 20° C., a peak $T_m$ (DSC) of about 150° C. to about 200° C., a melt flow index of about 1 g/10 min to about 40 g/10 min (e.g., about 10 to about 30 g/10 min) at 190° C. and 2.16 kg, a weight average molecular weight ($M_w$) of about 80,000 g/mol to about 600,000 g/mol, a number average molecular weight ($M_n$) of about 30,000 g/mol to about 300,000 g/mol, a polydispersity index (PDI) of about 1.1 to about 4, a flexural modulus (ASTM D790) of about 300 MPa to about 5000 MPa, an ultimate tensile strength (ASTM D638) of about 1000 MPa to about 8000 MPa, and an ultimate elongation (ASTM D638) of about 1% to about 100%

PLA can exist as two optically active forms: L-PLA and D-PLA. PLA can have any suitable D/L ratio, for example the ratio of the D- to L-enantiomer can be 100:0, 85:15, 75:25, 65:35, or 50:50, or a range between any two of these particular ratios. The ratio of D/L plays an important role in determining the thermal and physical properties of the PLA. PLA having a high L-enantiomer content (e.g., greater than about 90%) typically is more crystalline and has a longer degradation time, whereas PLA having a high D-enantiomer content (e.g., >15%) is more amorphous and has a shorter degradation time.

PLA also can be polymerized with diisocyanates to form poly(ester-urethanes) or with caprolactones to form poly(L-lactic acid-co-ϵ-caprolactone-urethanes). Such copolymers can be hard plastics or flexible elastomers and can have unique glass transition temperatures (e.g., about −70° C. to about +60° C.), tensile modulus (e.g., about 2 MPa to about 2000 MPa), and % strain (e.g., about 1% to about 1000%).

Additional features of biodegradable polymers, in particular PLA and PHB, are described in the following references: Jacobensen et al., *Polym. Eng. Sci.*, B6(22), 2799 (1996); Kim et al., *J. Korean Ind. & Eng. Chem.*, 3(3), 386 (1992); Ajioka et al., *J. Environ. Polym. Degradation*, 3(4), 225 (1995); Yim, *J. Korean Ind. & Eng. Chem.*, 3(3), 371 (1992); Lee, *Nature Biotechnol.*, 15, 17 (1997); Tsuji et al., *J. Appl. Polym. Sci.*, 60, 2367 (1996); Blumm, *Polymer*, 36, 4077 (1995); Gajira et al., *Polymer*, 37, 437 (1996); Brochu et al., *Macromolecules*, 28, 5230 (1995); Ikada et al., *Macromolecules*, 20, 904 (1987); and Grijpma et al., *Makromol. Chem. Rapid. Commun.*, 14, 155 (1993).

In some embodiments, it is desirable that the biodegradable polymer contains cross-links between the polymer chains. The introduction of cross-linking into the polymer can modify the physical properties of the polymer. For example, cross-linking can enhance the impact and tensile strength, the ductility, and elasticity of the polymer. In addition, cross-linking can reduce the water solubility of the polymer. Accordingly, the degree of cross-linking imparted to the biodegradable polymer will depend in part on the physical properties that are desired for a given polishing application.

The biodegradable polymer cross-linking can be carried out in situ or ex situ. Suitable polymer cross-linking agents for in situ cross-linking include those selected from the group consisting of 5,5'-bis(oxepane-2-one), spiro-bis-dimethylenecarbonate, trifunctional isocyanates, epoxides, maleic anhydrides, ester interchange, peroxides (e.g., dicumyl peroxide), difunctional compounds such as adipic acid and 1,4-dibutanediol, and combinations thereof. Ex situ cross-linking can be carried out by blending the biodegradable polymer (e.g., PLA) with acrylic acid compounds, which can form cross-links with the polymer upon exposure to ultraviolet irradiation, or with silane-functionalized compounds, which can form cross-links with the polymer upon exposure to elevated temperatures in the presence of water. The properties and methods of producing cross-linked PLA are described, for example, in Nijenhuis et al., *Polymer*, 37, 2783 (1996); Grijpma et al., *Polymer*, 34, 1496 (1993); Hiltunen et al., *J. Appl. Polym. Sci.*, 63, 1091 (1997); and Hiltunen, *Acta Polytech. Scand., Chem. Technol. Ser.*, 251, 1 (1997).

The cross-linked biodegradable polymer material can act as a matrix for embedded abrasive particles. The abrasive particles can be any suitable abrasive particles. For example, the abrasive particles can be inorganic particles or polymer particles. Preferably, the abrasive particles are selected from the group consisting of metal oxide particles (e.g., titania, zirconia, alumina, silica, magnesia, germania, ceria, chromia, iron oxide, and composites thereof), nitride particles (e.g., boron nitride or silicon nitride), silicon carbide particles, diamond particles, ceramic particles, and combinations thereof.

In other embodiments, the biodegradable polymer desirably is blended with a secondary component to modify the physical properties of the polishing pad. The secondary component can be blended with a prepolymer solution or with a molten post-polymer mixture such that the secondary component is dispersed throughout the body of the polishing pad. Such secondary components include substantially non-biodegradable polymer resins, abrasive particles, fillers, plasticizers, or combinations thereof. The substantially non-biodegradable polymer resin typically is selected from the group consisting of thermoplastic elastomers, thermoplastic polyurethanes, thermoplastic polyolefins, polycarbonates, polyvinylalcohols, nylons, elastomeric rubbers, elastomeric polyethylenes, polytetrafluoroethylenes, polyethyleneterephthalates, polyimides, polyaramides, polyarylenes, polystyrenes, polymethylmethacrylic acids, polyethylene oxides, rubbers, nylons, copolymers thereof, and mixtures thereof. Preferably, the biodegradable polymer is blended with a thermoplastic polyurethane resin. The abrasive particles can be any of the abrasive particles described above. The fillers and/or plasticizers can be any suitable materials. For example, the filler can be a phyllosilicate material (e.g., mica or fluorinated mica), a clay (e.g., montmorillonite, kaolinite, hectorite, or talc), or a combination thereof. Talc often is used as a crystallization (e.g., nucleating) agent during polymerization of PLA. Suitable plasticizers include citrate esters, glycols, fatty acids, glucose monoesters, and combinations thereof. The addition of plasticizers to the biodegradable polymer can enhance the polymer's flexibility and processability.

In one embodiment, the biodegradable polymer is selected such that it can be extruded to form a solid or nearly solid polishing pad. PLA having a higher Shore D hardness (e.g., about 60 to about 90), $T_g$ (e.g., about 55° C. to about 65° C.), $T_m$ (e.g., about 150° C. to about 180° C.), and crystallinity is particularly well suited to such extrusion methods. The biodegradable polymer (e.g., micropellets of PLA) can be dispersed in a substantially non-biodegradable polymer having a lower melting temperature and extruded. Micropellets of the biodegradable polymer also can be joined together through thermal fusion (e.g., sintering) to produce porous materials having closed or open, interconnected pores. In some embodiments, it is desirable to combine the micropellets of biodegradable polymer with a binder to produce a porous pad material. Desirably, the polishing pad comprises about 50% or more (e.g., about 60% or more, or about 70% or more) biodegradable polymer.

If a water-soluble PLA is used, the resulting sheet can be washed with water to remove the PLA micropellets yielding a microporous, non-biodegradable polymer sheet. Similarly, water-soluble PLA micropellets can be extruded with another water-soluble polymer to produce a solid polymer sheet. By cross-linking the PLA to render it water-insoluble, the secondary water-soluble polymer can be extracted to produce a microporous PLA-based polishing pad.

In another embodiment, the biodegradable polymer is spun into fibers and used to form a nonwoven web. Such nonwoven webs can be used in soft polishing applications, for example for polishing rigid disks, magnetic heads, or in second step copper polishing. In addition, a nonwoven pad of biodegradable polymer can be used as a polishing subpad. In a preferred embodiment, the polishing pad comprises a polishing layer and a subpad layer, wherein the nonwoven web comprising the biodegradable polymer is present in the subpad layer (e.g., similar to a Suba® IV pad commercially available from Rodel). The nonwoven web can be coated with any suitable additives, including UV-absorbers, heat and/or oxidation stabilizers, fillers (e.g., as described above), abrasive particles (e.g., as described above), and combinations thereof. The additives can be applied to the nonwoven web by any suitable technique. For example, such additives (e.g., in the form of a dispersion) can be deposited on the surface of the nonwoven web, or the additives can be combined with a binder such that the additive particles agglomerate and become adhered to the nonwoven web.

The polishing pad optionally further comprises grooves, channels, and/or perforations. Such features can facilitate the lateral transport of a polishing composition across the surface of the polishing pad. The grooves, channels, and/or perforations can be in any suitable pattern and can have any suitable depth and width. The polishing pad can have two or more different groove patterns, for example a combination of large grooves and small grooves as described in U.S. Pat. No. 5,489,233. The grooves can be in the form of slanted grooves, concentric grooves, spiral or circular grooves, or XY crosshatch pattern, and can be continuous or non-continuous in connectivity.

The polishing pad optionally further comprises regions of different density, porosity, hardness, modulus, and/or compressibility. The different regions can have any suitable shape or dimension. Typically, the regions of contrasting density, porosity, hardness, and/or compressibility are formed on the polishing pad by an ex situ process (i.e., after the polishing pad is formed). In some embodiments, it is desirable that the polishing surface of the polishing pad comprises abrasive particles disposed (e.g., deposited) thereon. The abrasive particles (e.g., as described above) can be disposed on the surface by being dispersed in a binder that then is coated on the surface, or they can be embedded into the surface of the polishing pad by softening the surface of the polishing pad and pressing the abrasive particles into the softened surface.

The polishing pad optionally further comprises one or more apertures, transparent regions, or translucent regions (e.g., windows as described in U.S. Pat. No. 5,893,796). The inclusion of such apertures or translucent regions is desirable when the polishing pad is to be used in conjunction with an in situ CMP process monitoring technique. The aperture can have any suitable shape and may be used in combination with drainage channels for minimizing or eliminating excess polishing composition on the polishing surface. The translucent region or window can be any suitable window, many of which are known in the art. For example, the translucent region can comprise a glass or polymer-based plug that is inserted in an aperture of the polishing pad or may comprise the same polymeric material used in the remainder of the polishing pad. Typically, the translucent regions have a light transmittance of about 10% or more (e.g., about 20% or more, or about 30% or more) at at least one wavelength in the range of about 200 nm to about 10,000 nm (e.g., about 200 nm to about 1,000 nm, or about 200 nm to about 780 nm). In some embodiments, the transparent or translucent regions of the polishing pad comprise the biodegradable polymer described above. For example, the polishing pad can comprise a region consisting essentially of cross-linked PLA or an optically active PLA.

The polishing pad is particularly suited for use in conjunction with a chemical-mechanical polishing (CMP) apparatus. Typically, the apparatus comprises a platen, which, when in use, is in motion and has a velocity that results from orbital, linear, or circular motion, a polishing pad of the invention in contact with the platen and moving with the platen when in motion, and a carrier that holds a workpiece to be polished by contacting and moving relative to the surface of the polishing pad intended to contact a workpiece to be polished. The polishing of the workpiece takes place by the workpiece being placed in contact with the polishing pad and then the polishing pad moving relative to the workpiece, typically with a polishing composition therebetween, so as to abrade at least a portion of the workpiece to polish the workpiece. The CMP apparatus can be any suitable CMP apparatus, many of which are known in the art. The polishing pad of the invention also can be used with linear polishing tools.

The polishing pad can be used alone or optionally can be mated to another polishing pad. For example, the polishing pad of the invention can be a subpad that is mated to a conventional polishing pad having a polishing surface, or the polishing pad of the invention can comprise a polishing surface and be mated to a conventional polishing subpad. Suitable polishing pads for use as the polishing surface in combination with a polishing pad of the invention include solid or porous polyurethane pads, many of which are well-known in the art. Suitable subpads include polyurethane foam subpads (e.g., Poron® foam subpads from Rogers Corporation), impregnated felt subpads, microporous polyurethane subpads, or sintered urethane subpads. The subpad typically is softer than the polishing pad of the invention and therefore is more compressible and has a lower Shore hardness value than the polishing pad of the invention. For example, the subpad can have a Shore A hardness of about 35 to about 50. In some embodiments, the subpad is harder, is less compressible, and has a higher Shore hardness than the polishing pad. The subpad optionally comprises grooves, channels, hollow sections, windows, apertures, and the like. The subpad can be affixed to the polishing layer by any suitable means. For example, the polishing layer and subpad can be affixed through adhesives or can be attached via welding or similar technique. Typically, an intermediate backing layer such as a polyethyleneterephthalate film is disposed between the polishing pad and the subpad. Of course, both the polishing pad and polishing subpad can comprise a biodegradable polymer.

Suitable workpieces include memory storage devices, glass substrates, memory or rigid disks, metals (e.g., noble metals), magnetic heads, inter-layer dielectric (ILD) layers, polymeric films, low and high dielectric constant films, ferroelectrics, micro-electro-mechanical systems (MEMS), semiconductor wafers, field emission displays, and other microelectronic workpieces, especially microelectronic workpieces comprising insulating layers (e.g., metal oxide, silicon nitride, or low dielectric materials) and/or metal-containing layers (e.g., copper, tantalum, tungsten, aluminum, nickel, titanium, platinum, ruthenium, rhodium, iridium, silver, gold, alloys thereof, and mixtures thereof). The term "memory or rigid disk" refers to any magnetic disk, hard disk, rigid disk, or memory disk for retaining information in electromagnetic form. Memory or rigid disks typically have a surface that comprises nickel-phosphorus, but the surface can comprise any other suitable material. Suitable metal oxide insulating layers include, for example, alumina, silica, titania, ceria, zirconia, germania, magnesia, and combinations thereof. In addition, the workpiece can comprise, consist essentially of, or consist of any suitable metal composite. Suitable metal composites include, for example, metal nitrides (e.g., tantalum nitride, titanium nitride, and tungsten nitride), metal carbides (e.g., silicon carbide and tungsten carbide), nickel-phosphorus, aluminoborosilicate, borosilicate glass, phosphosilicate glass (PSG), borophosphosilicate glass (BPSG), silicon/germanium alloys, and silicon/germanium/carbon alloys. The workpiece also can comprise, consist essentially of, or consist of any suitable semiconductor base material. Suitable semiconductor base materials include single-crystal silicon, poly-crystalline silicon, amorphous silicon, silicon-on-insulator, and gallium arsenide. Preferably, the workpiece comprises a metal layer, more preferably a metal layer selected from the group consisting of copper, tungsten, tantalum, platinum, aluminum, and combinations thereof. Even more preferably, the metal layer comprises copper.

The polishing composition of the polishing system typically comprises a liquid carrier (e.g., water) and optionally one or more additives selected from the group consisting of abrasives (e.g., alumina, silica, titania, ceria, zirconia, germania, magnesia, and combinations thereof), oxidizers (e.g., hydrogen peroxide and ammonium persulfate), corrosion inhibitors (e.g., benzotriazole), film-forming agents (e.g., polyacrylic acid and polystyrenesulfonic acid), complexing agents (e.g., mono-, di-, and poly-carboxylic acids, phosphonic acids, and sulfonic acids), pH adjustors (e.g., hydrochloric acid, sulfuric acid, phosphoric acid, sodium hydroxide, potassium hydroxide, and ammonium hydroxide), buffering agents (e.g., phosphate buffers, acetate buffers, and sulfate buffers), surfactants (e.g., nonionic surfactants), salts thereof, and combinations thereof. The selection of the components of the polishing composition depends in part on the type of workpiece being polished.

The polishing pad of the invention is particularly suited for polishing workpieces comprising a metal layer. While not wishing to be bound to any particular theory, it is believed that the highly polar nature of these biodegradable polymers will enable them to act as complexing agents with respect to metal ions that are generated during polishing of metal layers. By using a polishing pad having inherent complexing ability, the amount of complexing agent present in the polishing composition can be substantially reduced or even eliminated. For example, the polishing pad can be used in conjunction with a polishing composition comprising about 2 wt. % or less (e.g., about 1 wt. % or less, about 0.1 wt. % or less, or about 0.01 wt. % or less) complexing agent. In a related embodiment of the invention, the polishing pad can be used as a cleaning pad (e.g., cleaning brush) to remove unwanted polishing debris from the surface of a workpiece during and after polishing.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

What is claimed is:

1. A polishing pad for use in chemical-mechanical polishing comprising a biodegradable polymer, wherein the biodegradable polymer comprises (a) a repeat unit selected from the group consisting of L-lactic acid, D-lactic acid, or a combination thereof; or (b) a polymer selected from the group consisting of polyglycolide, polycaprolactone, poly(dioxanone), poly(trimethylene carbonate), polyglyconate, polybydroxybutyrate, polyhydroxyvalerate, poly(1,4-butylene succinate), poly(1,4-butylene adipate), polyanbydrides, polyorthoesters, DL-polylactide, D-polylactide, L-polylactide, poly(DL-lactide-co-glycolide), poly(ethylene glycol-co-lactide), poly(L-lactide-co-caprolactone-co-glycolide), and combinations thereof; and wherein the polishing pad has a polishing surface and is in the form of micropellets of the biodegradable polymer dispersed in a non-biodegradable polymer resin.

2. The polishing pad of claim 1, wherein the biodegradable polymer is cross-linked.

3. The polishing pad of claim 1, wherein the polishing pad further comprises abrasive particles.

4. The polishing pad of claim 3, wherein the abrasive particles are selected from metal oxide particles, boron nitride particles, diamond particles, ceramic particles, and combinations thereof.

5. The polishing pad of claim 3, wherein the abrasive particles are disposed on a polishing surface of the polishing pad or are dispersed throughout the body of the polishing pad.

6. The polishing pad of claim 1, wherein the non-biodegradable polymer resin is selected from the group consisting of thermoplastic elastomers, thermoplastic polyurethanes, thermoplastic polyolefins, polycarbonates, polyvinylalcohols, nylons, elastomeric rubbers, elastomeric polyethylenes, polytetrafluoroethylenes, polyethyleneterephthalates, polyimides, polyaramides, polyarylens, polystyrenes, polymethylmethacrylic acids, polyethylene oxides, rubbers, copolymers thereof, and mixtures thereof.

* * * * *